(12) United States Patent
Holme et al.

(10) Patent No.: US 8,163,338 B2
(45) Date of Patent: Apr. 24, 2012

(54) PRECURSOR SELECTION METHOD FOR CHEMICAL VAPOR DEPOSITION TECHNIQUES

(75) Inventors: Timothy P. Holme, Stanford, CA (US);
Friedrich B. Prinz, Woodside, CA (US);
Masayuki Sugawara, Palo Alto, CA (US)

(73) Assignees: The Board of Trustees of the Leland Stanford Junior University, Palo Alto, CA (US); Honda Motor Co., Ltd, Tokyo (JP)

( * ) Notice: Subject to any disclaimer, the term of this patent is extended or adjusted under 35 U.S.C. 154(b) by 852 days.

(21) Appl. No.: 12/070,389

(22) Filed: Feb. 14, 2008

(65) Prior Publication Data

US 2008/0243460 A1 Oct. 2, 2008

Related U.S. Application Data

(60) Provisional application No. 60/902,026, filed on Feb. 15, 2007.

(51) Int. Cl.
*C23C 16/00* (2006.01)
*G06G 7/58* (2006.01)

(52) U.S. Cl. .................................. 427/248.1; 703/12

(58) Field of Classification Search .................. None
See application file for complete search history.

(56) References Cited

U.S. PATENT DOCUMENTS

| | | | |
|---|---|---|---|
| 6,421,612 B1 * | 7/2002 | Agrafiotis et al. | 702/19 |
| 2003/0181037 A1 * | 9/2003 | Schneegans et al. | 438/666 |
| 2006/0172067 A1 | 8/2006 | Ovshinsky et al. | |

OTHER PUBLICATIONS

Hatanpaa, Dalton Transactions, p. 1181, 2004.*
Maung et al., The evaluation of bond dissociation energies for simple selenium-containing molecules using ab initio and density functional methods, Feb. 2, 1998, pp. 181-189, Journal of Molecular Structure (Theochem) 453 (1998), Wales, UK.

* cited by examiner

*Primary Examiner* — Timothy Meeks
*Assistant Examiner* — Joseph Miller, Jr.
(74) *Attorney, Agent, or Firm* — Lumen Patent Firm

(57) ABSTRACT

A method of precursor selection for thin film deposition is provided, that includes a group of precursors, using a rule-set for selecting one or more candidate precursors for thermal stability, high growth rate, and low contamination. Candidate geometries and constituent geometries are simulated and optimized, and bond strengths of the candidates and constituents are determined. The rule-set is based on bond strength that compares molecule and constituent energies between a set of bond strengths within a candidate ligand or between a metal atom and one ligand. The rule-set requires metal atom-ligand bonds are between 0.2 and 3 eV, metal atom-ligand bond strengths are less than metal atom-ligand bond strengths of other candidates. The metal atom-ligand bond strength is $>T\Delta S$, where T is a reaction temperature and $\Delta S$ is the reaction entropy change and the bond within a ligand, where (ligand bond)>(metal atom and ligand bond).

4 Claims, 8 Drawing Sheets

PRECURSOR SELECTION METHOD FOR CHEMICAL VAPOR DEPOSITION TECHNIQUES

CROSS-REFERENCE TO RELATED APPLICATIONS

This application claims priority from U.S. provisional patent application 60/902,026, filed Feb. 15, 2007, which is incorporated herein by reference.

FIELD OF THE INVENTION

The invention relates generally to thin film deposition. More particularly, the invention relates to a method of screening available precursors and target material to select a precursor with optimal growth rate and minimal contamination in the as-grown film.

BACKGROUND

Fabrication of thin films of Ba- and Sr-containing oxides has recently been the focus of research by many groups. These thin oxide films have shown much promise for applications such as (Ba, Sr)$TiO_3$ insulators for dynamic random access memories, $SrTiO_3$ for ferroelectrics, $SrBi_2Ta_2O_9$ and $SrBi_2Nb_2O_9$ for computer memory, $YBa_2Cu_3O_{7-x}$ and $Bi_2Sr_2CaCu_2O_{8+\delta}$ for high-$T_c$ superconductors, SrS:Ce for electroluminescent films, $BaZrO_3$ ionic conductors in fuel cell electrolytes, and $(La_xSr_{1-x})MnO_3$, $(La_xSr_{1-x})CoO_3$ for mixed-electronic ionic conductors in fuel cell cathodes. Different fabrication methods have been used to create these oxide thin films, including Metalorganic Chemical Vapor Deposition (MOCVD), Plasma Enhanced Chemical Vapor Deposition (PECVD), Molecular Beam Epitaxy (MBE), Atomic layer deposition (ALD) and Chemical Vapor Deposition (CVD).

Precursor selection is a crucial first step in fabricating these oxide films, where the nature of the precursor determines deposition conditions such as flow rate, temperature, pressure, and the characteristics of the grown film such as thickness, composition and morphology. The most commonly used Sr precursor cited in literature is the β-diketonate precursor $Sr(tmhd)_2$ (tmhd=2,2,6,6-tetramethyl-3,5-heptanedione) (also referred to as dipivaloylmethane or DPM). ALD of Sr with tmhd precursors often leads to films with significant carbon contamination or formation of the $SrCO_3$ phase. Cyclopentadienyl (Cp) precursors and their derivatives have been more successful in deposition of Sr films, where carbon contamination levels were very low (<0.3 at %). It has been reported that the most thermally stable and volatile Ba precursors are Cp precursors with tert-Butyl and isopropyl ligands.

It has been further reported that the vapor pressure stability of $Ba(tmhd)_2$ is low at typical growth temperatures. It is known that Sr and $Ba(tmhd)_2$ precursors decompose in the gas phase at substrate temperatures 300° C., whereas Sr or Ba atoms are incorporated into films at substrate temperatures of greater than or about equal to 400° C. Precursor thermal decomposition suggests that such a precursor will not be suited to ALD, as self-limiting reaction cannot be achieved.

Computational screening shows much promise as a much faster test of a precursor than experimental use. In addition, it may provide insight into the design of an optimal precursor. Accordingly, there is a need to develop a method by which precursors may be tested computationally for their suitability for deposition processes.

SUMMARY OF THE INVENTION

The current invention provides a method of precursor selection for thin film deposition. The method includes providing a group of precursors, then using a rule-set for selecting one or more candidate precursors from the group, where the candidate has a propensity for thermal stability, high growth rate, and low contamination. The method further includes simulating a geometry optimization of the candidate, simulating a geometry optimization of constituents of the candidate, and determining bond strengths of the constituents of the candidate, where the rule-set is based on the bond strengths.

In one aspect of the invention, the separate constituent simulation is selected from a group consisting of ligands, fragments, and atoms.

In another aspect, the constituent bond strength selection includes comparing an energy of a molecule to an energy of the molecule constituents, whereby the comparison can be between a set of bond strengths within a candidate ligand or between a metal atom and one ligand.

In a further aspect of the invention, the rule-set includes a bond between a metal atom and the ligand is between 0.2 and 3 eV, the bond strength between the metal atom and the ligand is less than metal atom-ligand bond strengths of other the candidates, where the metal atom and ligand bond strength is greater than TΔS, whereby T is a reaction temperature and ΔS is a change in entropy of the reaction. The rule-set further includes the bonds within a ligand, where the bonds within the ligand are stronger than the metal atom and ligand bond.

In yet another aspect of the invention, the precursor selection is applied to methods of film deposition, where the film deposition can be chemical vapor deposition, metaorgainc chemical vapor deposition, plasma enhanced chemical vapor deposition, atomic layer deposition, or molecular beam epitaxy.

In another aspect of the invention, the thin film is applied to materials including ceramics and metals.

In a further aspect of the invention, the precursor selection uses any quantum calculation.

In another aspect, the precursor selection is applied to at least two precursors of a material to be deposited, where the precursors may be ranked selectively for producing the material according to the rule-set.

In another aspect, the precursor has at least two separate constituents. Here, the constituents can be at least one metal atom and at least one ligand.

BRIEF DESCRIPTION OF THE FIGURES

The objectives and advantages of the present invention will be understood by reading the following detailed description in conjunction with the drawing, in which.

DETAILED DESCRIPTION OF THE INVENTION

Although the following detailed description contains many specifics for the purposes of illustration, anyone of ordinary skill in the art will readily appreciate that many variations and alterations to the following exemplary details are within the scope of the invention. Accordingly, the following preferred embodiment of the invention is set forth without any loss of generality to, and without imposing limitations upon, the claimed invention.

Figure 1:
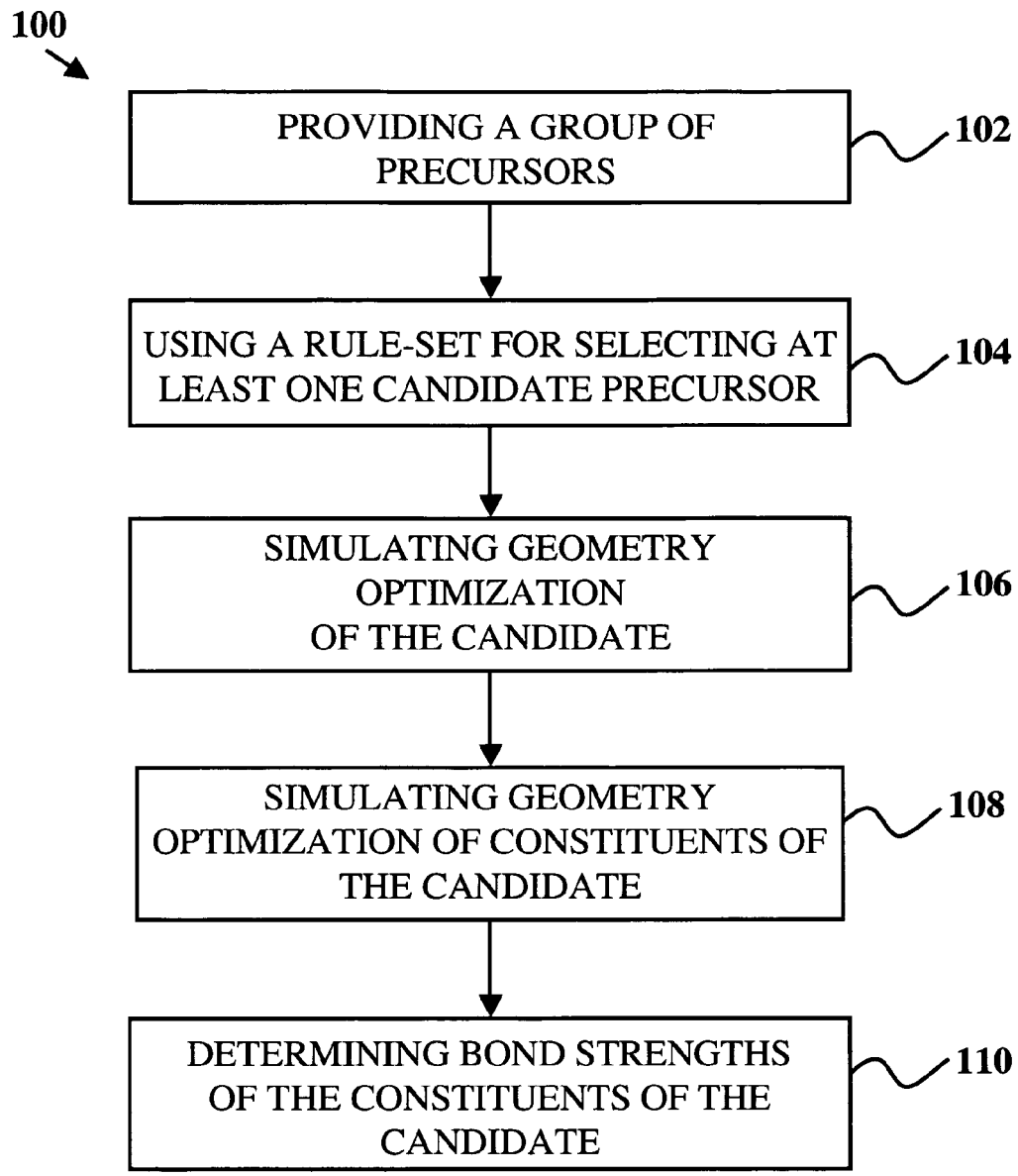
FIG. 1 shows a flow diagram of a method of precursor selection for thin film deposition according to the present invention.

FIG. 1 shows the method of precursor selection for thin film deposition 100 according to the current invention. The method includes providing a group of precursors 102, then using a rule-set for selecting one or more candidate precursors 104 from the group, where the candidate has a likelihood for thermal stability, high growth rate, and low contamination. The method 100 further includes simulating a geometry optimization of the candidate 106, simulating a geometry optimization of constituents of the candidate 108, and determining bond strengths 110 of the constituents of the candidate, where the rule-set is based on the bond strengths. In one aspect of the invention, the precursor selection can use any quantum calculation. The precursor selection can be applied to at least two precursors of a material to be deposited, where the precursors may be ranked selectively for producing the material according to the rule-set.

In the selection method for precursors in a deposition process, the precursors are tested computationally for their suitability for a given deposition process. Useful precursors according to the current invention include:

M(x)$_2$ (M=Sr, Ba; x=tetramethylheptanedionate (tmhd), acetylacetonate (acac),
hexafluoroacetylacetonate (hfac),
cyclopentadienyl (H$_5$C$_5$),
pentamethylcyclopentadienyl (Me$_5$C$_5$),
n-propyltetramethylcyclopentadienyl (PrMe$_4$C$_5$),
tris(isopropylcyclopentadienyl) (Pr$_3$$^i$H$_2$C$_5$),
tris(isopropylcyclopentadienyl)(THF) (Pr$_3$$^i$H$_2$C$_5$)(OC$_4$H$_8$),
tris(isopropylcyclopentadienyl)(THF)$_2$ (Pr$_3$$^i$H$_2$C$_5$)(OC$_4$H$_8$)$_2$,
tris-(tert-butylcyclopentadienyl) (Bu$_3$$^t$H$_2$C$_5$),
tris(tert-butylcyclopentadienyl)(THF) (Bu$_3$$^t$H$_2$C$_5$)(OC$_4$H$_8$), and
heptafluoro-2,2-dimethyl-3,5-octanedionate (fod)).

Figure 2:
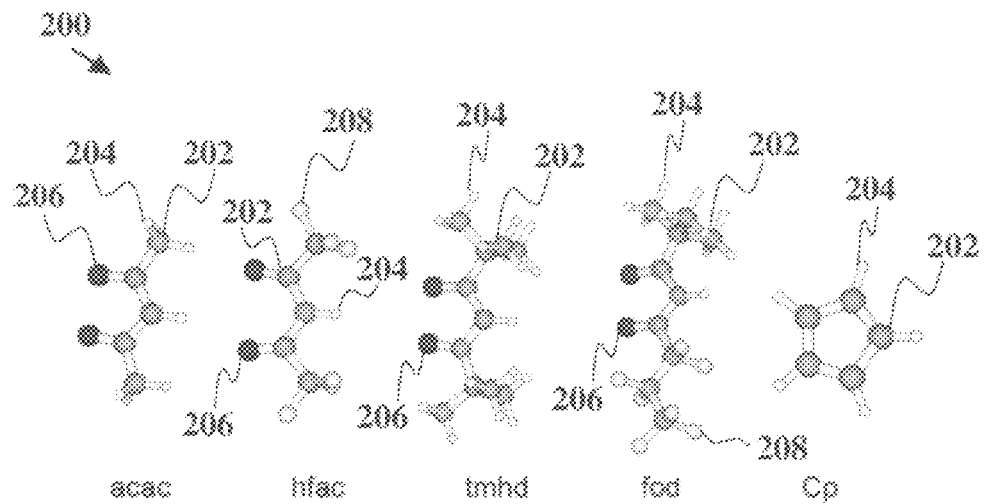
FIG. 2 shows optimized geometry of different ligands according to the present invention.
Figure 2:
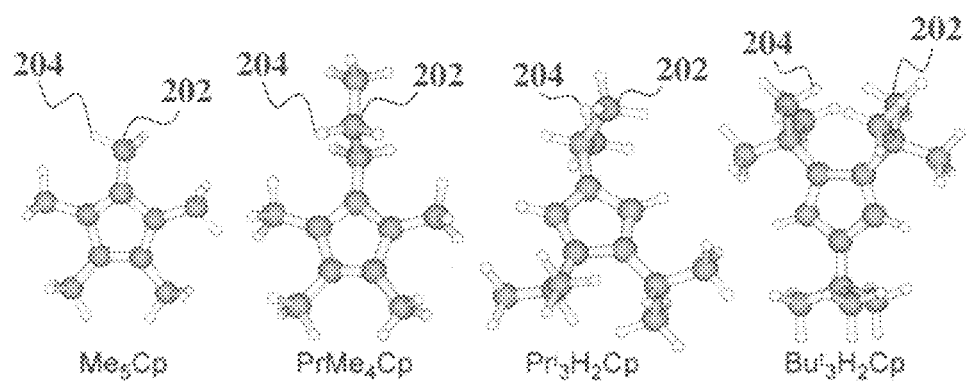

FIG. 2 shows the optimized geometry of different ligands 200 that include Carbon 202, hydrogen 204, oxygen 206, and fluorine 208 atoms.

Use of the rule-set 104 includes establishing that a bond strength between a metal atom and the ligand 200 is between 0.2 and 3 eV, verifying that a bond strength between the metal atom and the ligand 200 has a bond strength that is less than the metal atom-ligand bond strengths of other candidates, where the bond strength between the metal atom and ligand 200 is greater than T$\Delta$S, whereby T is a reaction temperature in degrees Kelvin and $\Delta$S is a change in entropy of the reaction. The rule-set further includes ensuring a bond within the ligand 200 is greater than the metal atom and ligand bond. By comparing the energy required for bond breaking among different precursors, a prediction can be made about which precursors have favorable driving forces for a given reaction.

The geometry optimization of the candidate is simulated, in addition to simulating the geometry optimization of the constituents of the candidate. Further, the bond strengths of the constituents of the candidate are determined, where the rule-set is based on the bond strengths.

An example calculation is provided to illustrate the details of the calculations. A Los Alamos basis set LANL2DZ (effective core potential and a double-$\zeta$ valence shell) was used for Sr and Ba; for all other atoms the basis set used was 3-21G or 6-311G as described below. Both Hartree-Fock (HF) and Becke's generalized gradient approximation with the Lee-Yang-Parr correlation functional (B3LYP) were used for calculations. The geometry of each molecule was optimized at the HF/3-21G+LANL$_2$DZ level and subsequently refined at the B$_3$LYP/6-311G+LANL$_2$DZ level. B$_3$LYP/LANL$_2$DZ has previously been applied to studying ALD reactions. All reported energies are found at the B$_3$LYP/6-311G+LANL$_2$DZ level. Gaussian '03 was used for all calculations.

The constituent bond strength selection includes comparing an energy of a molecule to an energy of the molecule constituents, whereby the comparison can be between a set of bond strengths within a candidate ligand or between a metal atom and one ligand.

To calculate the bond energy of compound AB, the following formula was used $$E=E_A+E_B-E_{AB},$$

where $E_{AB}$ is the energy of the compound, and $E_{A,B}$ are the energies of the constituents A and B, each after their geometry has been optimized. In this definition, the energy required to break a bond between two constituents is positive (requires energy input).

Table 1 shows the calculated energy (in eV) required to break bonds between the first and second ligand and Sr and Ba for each precursor studied. The listed values represent the energy required to break the bones in the precursor molecule between the first ligand and the M-ligand complex and between the second ligand and the M atom. For a facile ALD reaction, it is desirable to have the ligand weakly bound to the metal. It can be seen that the Cp compounds have weaker bonds to M than the β-diketonates, and that the first ligand is bound more tightly to M than the second ligand. Fluorinated compounds are bound more tightly than unfluorinated relatives. The bonds between Cp rings and M weaken when methyl groups are substituted for hydrogen in the ring, but the chemistry is relatively unchanged when a propyl group is substituted for a methyl group. The trends between Ba and Sr are well matched, with the first ligand being slightly more strongly bonded to Sr, and the second ligand has a slightly stronger bond to Ba. The Ba—O bond is longer than the Sr—O bond in the tmhd precursor (2.60 Å compared to 2.43 Å from these calculations), so the Sr—O bond is stronger than the Ba—O bond.

TABLE 1

| Precursor | First Ligand | Second Ligand |
| --- | --- | --- |
| Sr(acac)$_2$ | 4.99 | 3.79 |
| Sr(hfac)$_2$ | 5.45 | 4.33 |
| Sr(tmhd)$_2$ | 4.94 | 3.75 |
| Sr(fod)$_2$ | 5.38 | 4.18 |
| Sr(Cp)$_2$ | 3.10 | 1.88 |
| Sr(Me5Cp)$_2$ | 2.42 | 1.24 |
| Sr(PrMe4Cp)$_2$ | 2.43 | 1.24 |
| Sr(Pr$^i$3H2Cp)$_2$ | 2.58 | 1.40 |

TABLE 1-continued

| Precursor | First Ligand | Second Ligand |
|---|---|---|
| Sr(Bu$^t$3H2Cp)$_2$ | 2.54 | 1.38 |
| Ba(acac)$_2$ | 4.85 | 3.88 |
| Ba(hfac)$_2$ | 5.42 | 4.50 |
| Ba(tmhd)$_2$ | 4.80 | 3.84 |
| Ba(fod)$_2$ | 5.30 | 4.31 |
| Ba(Cp)$_2$ | 3.10 | 2.03 |
| Ba(Me5Cp)$_2$ | 2.38 | 1.38 |
| Ba(PrMe4Cp)$_2$ | 2.40 | 1.40 |
| Ba(Pr$^i$3H2Cp)$_2$ | 2.59 | 1.56 |
| Ba(Bu$^t$3H2Cp)$_2$ | 2.61 | 1.54 |

Figure 3:
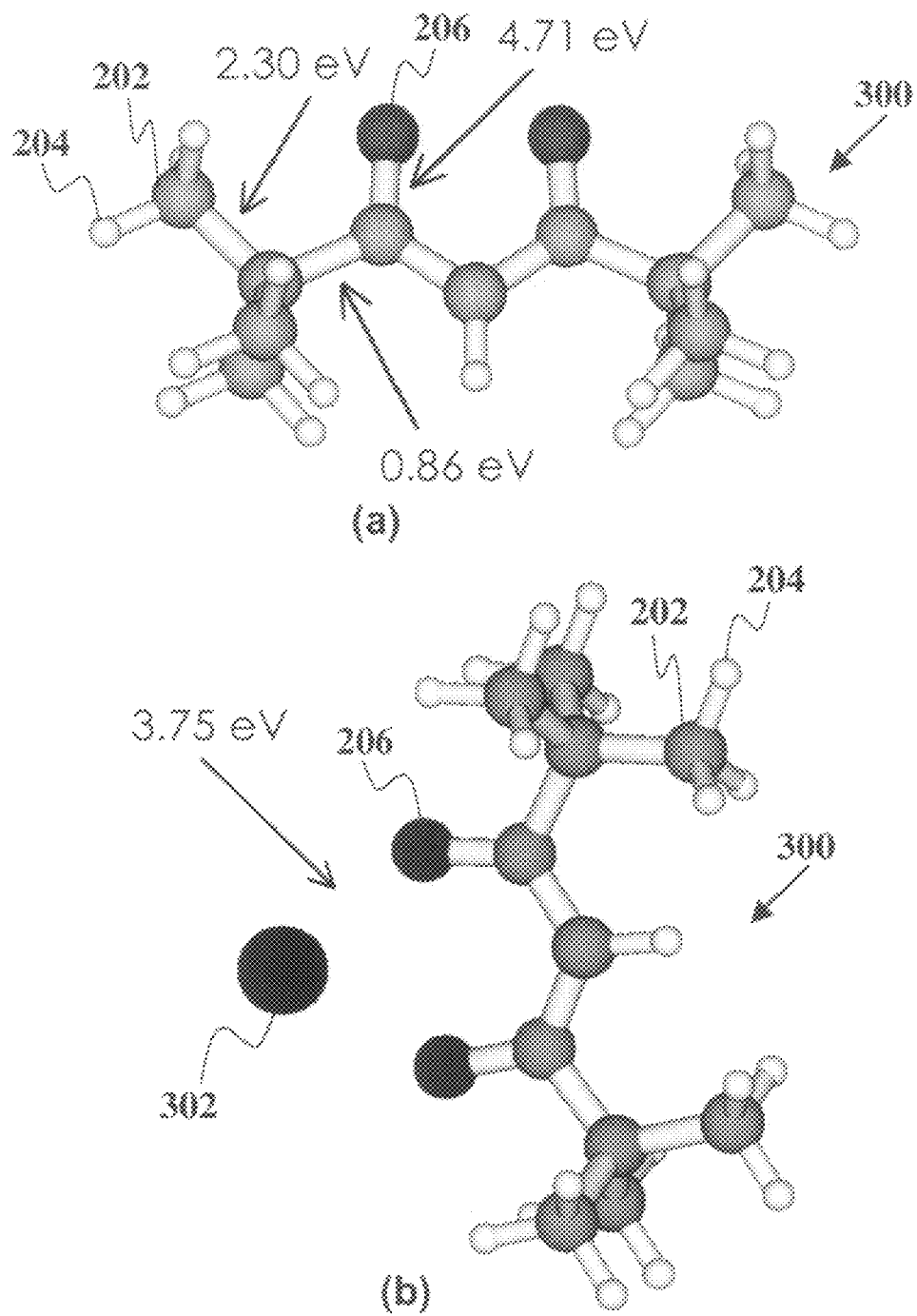
FIGS. 3 (a) and (b) shows the energy (in eV) required to break bonds within a single tmhd ligand according to the present invention.

To investigate the most likely sources for carbon contamination in Sr films grown with diketonate precursors, various bonds in the tmhd ligand were broken. The results are illustrated in FIGS. 3(a) and 3(b), which show the energy required to break bonds within a single tmhd ligand 300 (2.30 eV, 4.71 eV, 0.86 eV), whereby as a comparison, the ligand 300 is bound to the Sr atom 302 with a bond energy of 3.75 eV. The bonds within the ligand 300 are weaker than the bond between the ligand 300 and the M atom, so it is likely that the ligand 300 thermally decomposes before incorporation into the film. The weakest bond is between the C(CH$_3$)$_3$ group and the rest of the ligand 300, suggesting that it is the most likely bond to decompose.

Figure 4:
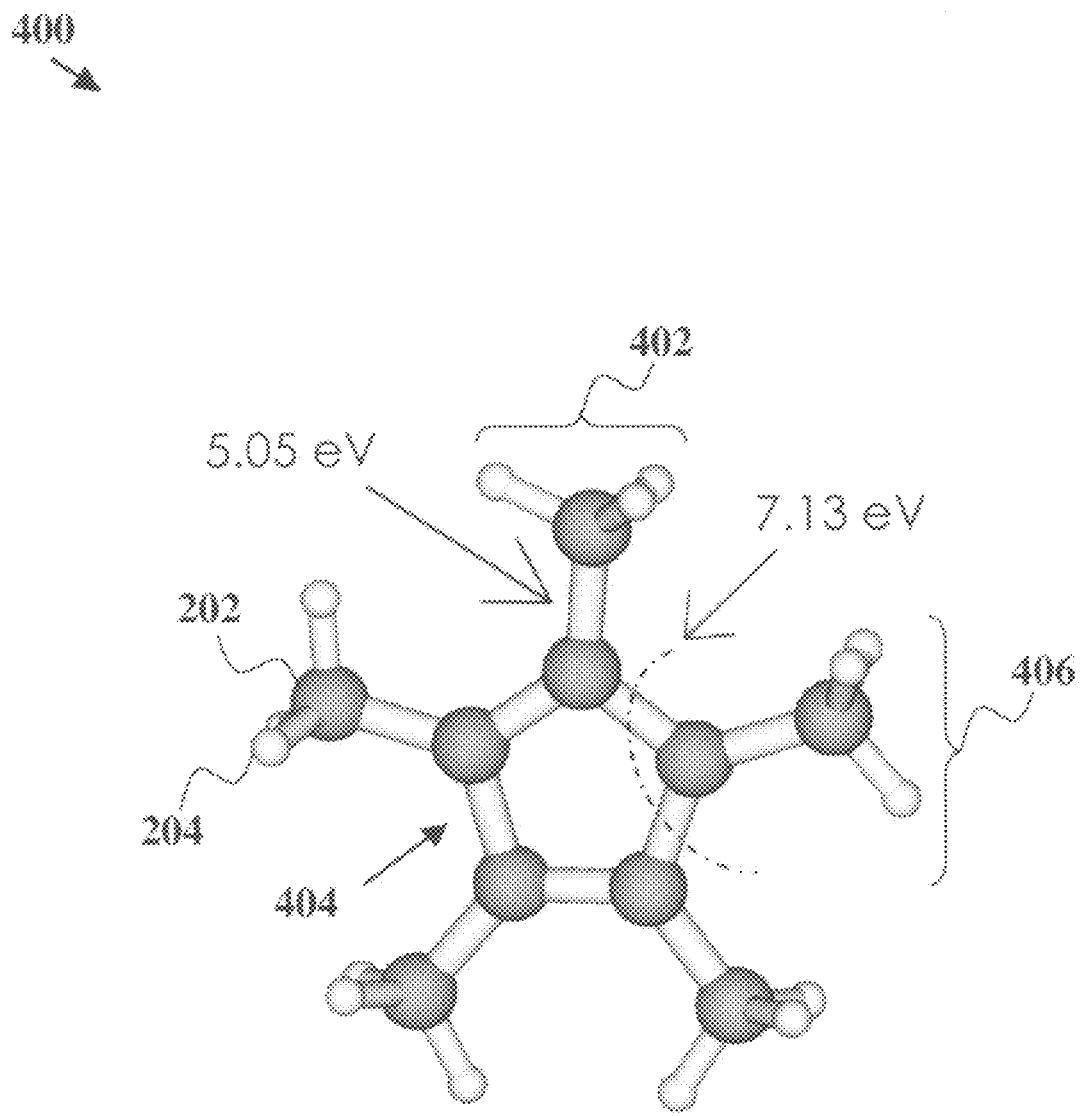
FIG. 4 shows the energy (in eV) required to break bonds within a single $Me_5Cp$ ligand according to the present invention.
Figure 5:
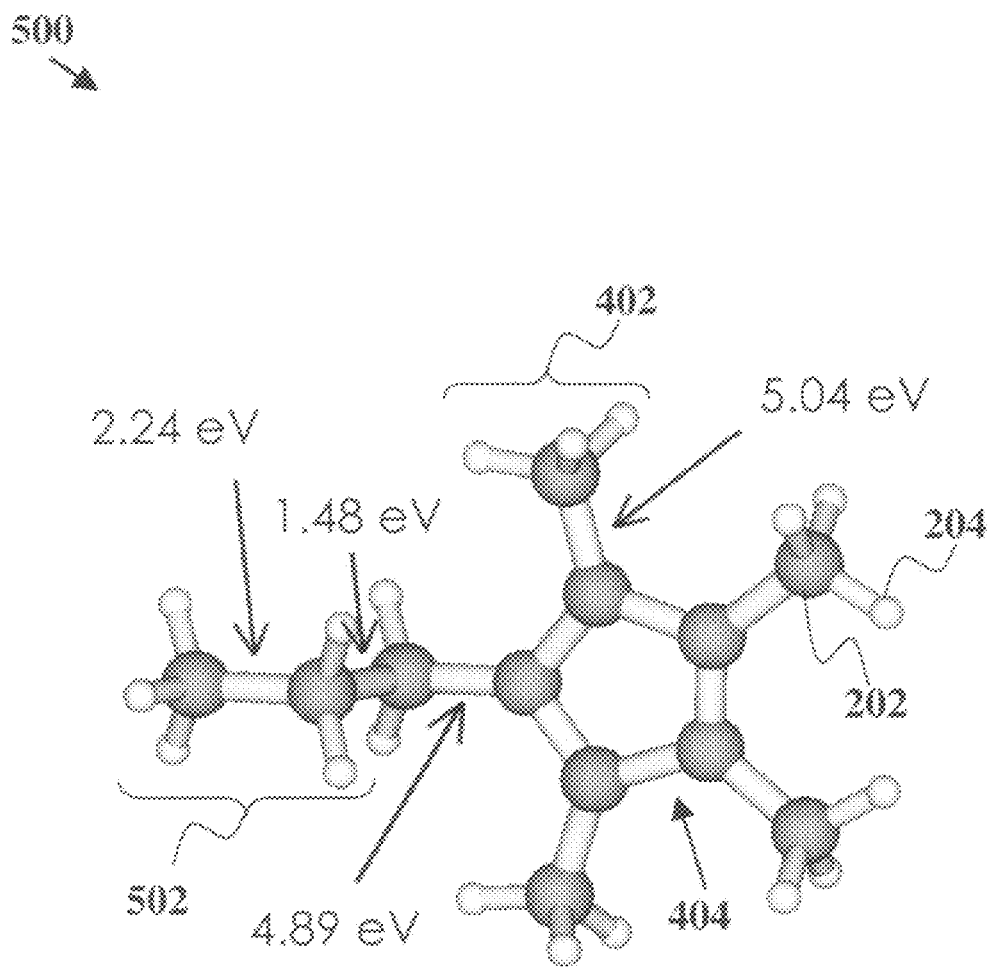
FIG. 5 shows the energy (in eV) required to break bonds within a single PrMe4Cp ligand optimized geometry of different ligands according to the present invention.

For comparison, the energy required to break bonds in Me$_5$Cp 400 and PrMe$_4$Cp 500 are provided in FIGS. 4 and 5. The energy (in eV) required to break bonds within a single Me$_5$Cp ligand 400 is shown in FIG. 4. In Me$_5$Cp 400, to remove a methyl group 402 from the ring costs 404 5.05 eV, and to remove a CCH$_3$ group 406 from the ring 404 requires 7.13 eV. Both of these are larger than the energy required to break bonds in tmhd precursors, showing that the Me$_5$Cp ligand is more stable and less likely to cause carbon contamination in the film.

FIG. 5 shows the energy (in eV) required to break bonds within a single PrMe$_4$Cp ligand 500. The energy cost to break a bond between the ring 404 and a methyl group 402 is equal to that in the Me$_5$Cp ligand (5.04 eV) to within the accuracy of the calculation. The weak bond in the ligand 500 is between the ethyl CH$_3$CH$_2$ group 502 (1.48 eV). This bond is more stable than the weakest bond in the tmhd ligand. Therefore the precursors containing Cp ligands are expected to decompose less readily than the precursors containing tmhd ligands.

Figure 6:
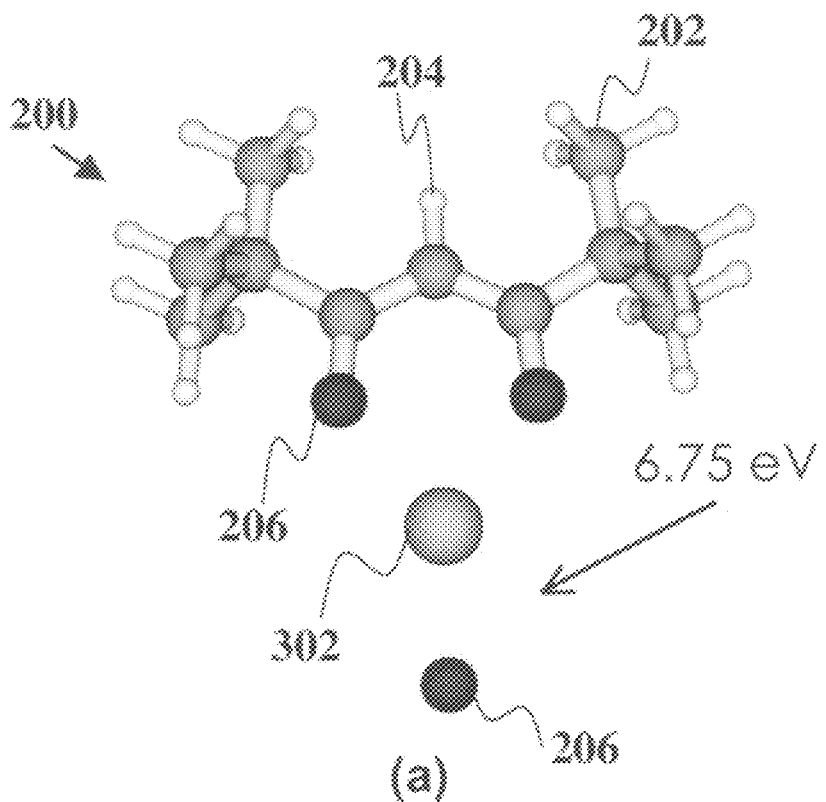
FIGS. 6 (a) and (b) show stable geometry of Sr bonded to one tmhd ligand and to one and two oxygen atoms, respectively according to the present invention.
Figure 6:
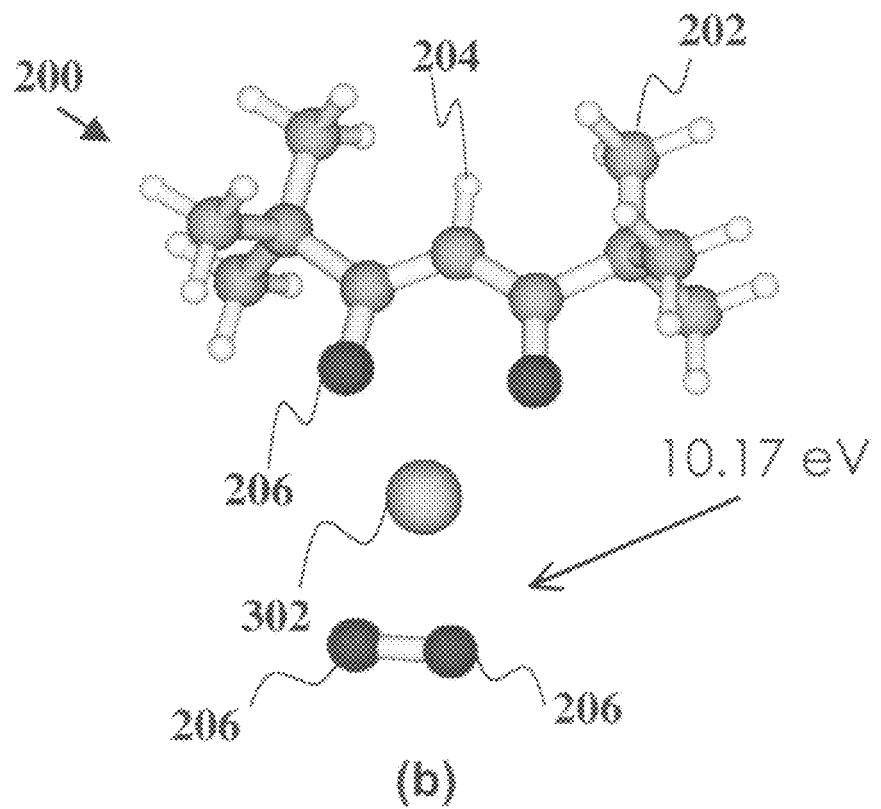

Referring to FIGS. 6 (a) and (b), to verify that the Sr—O bonds in the tmhd precursor are broken rather than the O—C bonds, the bond strength of each bond was calculated. FIGS. 6 (a) and (b) show stable geometries of Sr 302 bonded to one tmhd ligand 200 and one oxygen atom 206 (shown in FIG. 6 (a)) or two oxygen atoms 206 (shown in FIG. 6 (b)) from the second tmhd ligand 200 (not shown). For Sr atom 302 bonded to one tmhd ligand 200 and one or two oxygen atoms 206, the energy to remove the remainder of the second ligand 200 is 6.75 for 6 (a) and 10.17 eV for 6 (b). Since these energy barriers are quite large, we expect the entire ligand 200 to be removed from the Sr atom 302. Indeed, an isotopic exchange experiment shows that the majority of the oxygen atoms 206 in the resulting film come from the gas phase rather than the ligand 200.

The precursor selection method is applied to methods of film deposition such as chemical vapor deposition, metalorganic chemical vapor deposition, plasma enhanced chemical vapor deposition, atomic layer deposition, or molecular beam epitaxy. To demonstrate the efficacy of the precursor selection method 100, ALD of SrO films was performed on Si (100) substrates in a commercial reactor (Cambridge Nanotech Savannah 200) with Sr(PrMe$_4$Cp)$_2$.dimethoxyethane (Alfa Aesar J27Q052) and Sr(tmhd)$_2$ (Strem B1950041). The oxygen sources were oxygen (Praxair 99.993%), ozone (ozone generator MKS AX8560) and deionized water.

The source temperature was varied from 50-200° C., the substrate temperature was varied from 150-350° C. The lines and valves leading from the source to the reactor were heated to a temperature between the source and substrate temperature, as were the reactor walls. Typical ozone or oxygen pulse times were 4 s, typical water pulse times were 0.5 s, and typical precursor pulse times were 0.2 s. The purge time between pulses was 10-15 s. An oxygen flow rate of 0.5 slm was maintained by a mass flow controller.

Films were characterized by ellipsometry, x-ray photoemission spectroscopy (XPS), x-ray diffraction (XRD), and scanning electron microscopy (SEM). Depth profiling with XPS was done by sputtering with Ar ions at 3 kV, 10 mA, $1 \times 10^{-7}$ torr giving a sputtering rate of approximately 1 Å/s.

Figure 7:
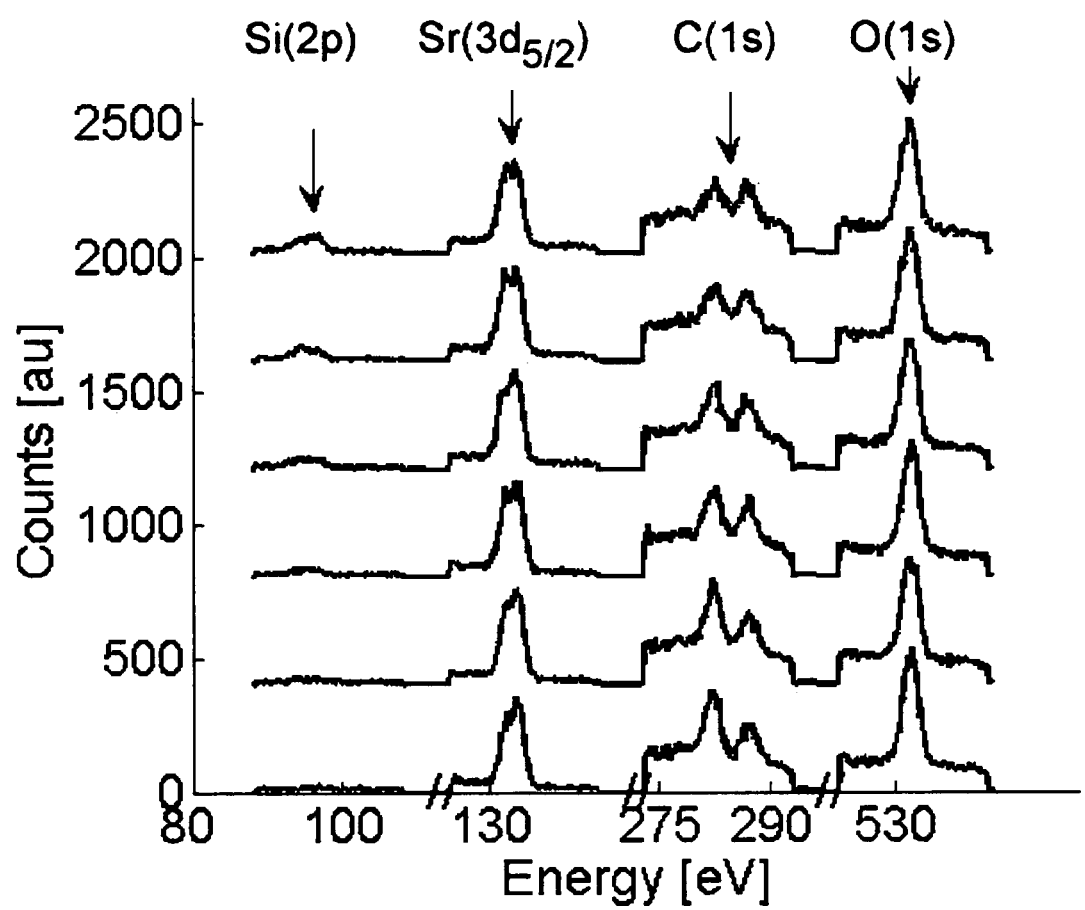
FIG. 7 shows XPS depth profile of SrO grown on a Si substrate with water and Sr(PrMe$_4$Cp)$_2$ according to the present invention.
Figure 8:
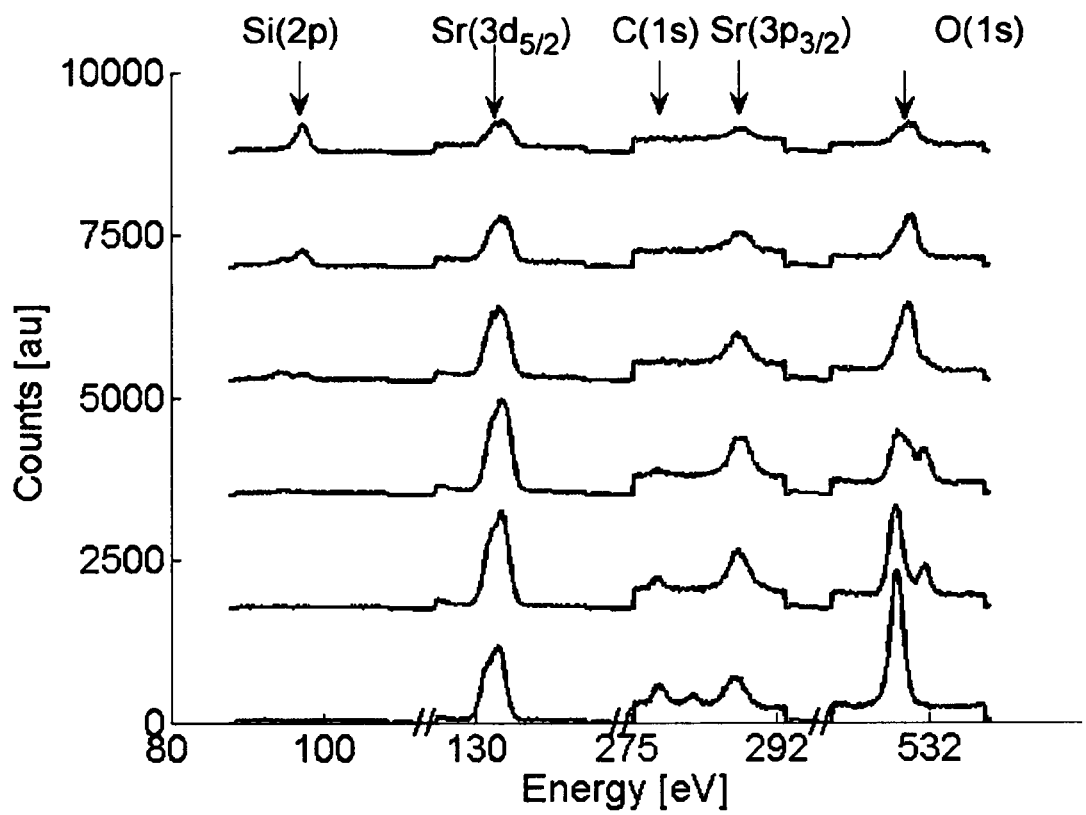
FIG. 8 shows XPS depth profile of SrO grown on a Si substrate with water, oxygen, and Sr(PrMe$_4$Cp)$_2$

Growth of SrO with Sr(PrMe$_4$Cp)$_2$ was observed in an ALD window of 250-350° C. and source temperatures 190-200° C. with oxygen and water as oxidants. Growth rates with oxygen were approximately 0.07 Å/cycle, independent of substrate temperature within the ALD window. Growth rates with water were approximately 0.2 Å/cycle, also independent of substrate temperature in the window. FIG. 7 shows XPS depth profile of SrO grown on a Si substrate with water and Sr(PrMe$_4$Cp)$_2$. The Si signal is due to the substrate. Measurements after 2 nm sputtering are offset along the y-axis for clarity. Note the broken x-axis. The Depth profiling with XPS showed C contamination throughout the film grown with water. Growth with pulses of both water and oxygen between Sr precursor pulses was tested. Using both oxygen and water, films grew at growth rates of 0.4 Å/cycle. FIG. 8 shows XPS depth profile of SrO grown on a Si substrate with water, oxygen, and Sr(PrMe$_4$Cp)$_2$. The Si signal is from the substrate. Measurements after 1 nm material sputtered away are offset along the y-axis for clarity. Note the broken x-axis. Carbon contamination in the bulk was diminished. It should be obvious to one skilled in the art that the thin film can be applied to materials including ceramics and metals.

An ideal precursor has a relatively weak bond between the metal atom and the ligand. To further weaken the bond between M and the ligand, the ligand should donate charge to antibonding orbitals between M and the ligand. When substituted for methyl groups in β-diketonates, the strongly electronegative fluorine (F) draws charge density towards itself, removing charge from antibonding orbitals, and strengthening the M-ligand bond. Therefore, fluorinated precursors sacrifice ease of reaction, and therefore growth rate, for greater volatility. Further, some have noted F contamination in films grown with hfac precursors. Therefore, it is hypothesized that hfac and fod are not preferred precursors for Sr and Ba film growth. The strong tmhd-Sr bonds explain why reaction with water or oxygen does not occur at temperatures below their thermal decomposition temperature, and therefore require the much more reactive ozone to be used as the oxygen source.

Cyclopentadienyl precursors have much weaker bonds to Sr and Ba than β-diketonates. When electron donating methyl groups are substituted for hydrogen on the Cp ring, the bond is further weakened. It seems that substituting longer carbon chains for methyl groups does not greatly affect the bond strength between M and the ligand.

The weakest bond in tmhd precursors is that between the C(CH$_3$)$_3$ end group and the rest of the ligand. This group is less weakly bound than the metal atom, thus this bond is the most likely site for reaction or decomposition. If the C(CH$_3$)$_3$ group is broken, the radical could react with Sr—O bonds in the growing film, thus describing a likely route for carbon incorporation into the film. If the group reacts with ozone in the gas phase, it may be further broken down or passivated.

A method was presented to computationally screen precursors for suitability in deposition processes. A quantum chemical study of the precursor reaction thermochemistry proves to be a good predictor of ease of use in ALD growth.

Fluorine containing precursors, though they have higher vapor pressure, are not desirable because strong ligand-M bonds result in low growth rates and weak bonds in the ligand result in probable F contamination in the grown films. Diketonates have stronger bonds to metal atoms than cyclopentadienyl rings and weaker bonds within the ligand, suggesting that diketonate precursors will have lower growth rates and more likely carbon contamination in the film.

Experimental observations of C and F contamination in films grown with diketonate precursors are explained by the weak bonds within the ligand. Isotope exchange experiments showing that O content in the film comes from the gas phase rather than the ligand are supported by the inventor's finding that the Sr—O bond is weaker than the O—C bond in the diketonate ligand.

Deposition with the $Me_5Cp$ precursor has been accomplished at reasonable temperatures of sublimation with growth rates of 0.4 Å/cycle and low carbon contamination in the bulk. Growth rates with different oxygen sources increased in the order $O_2 < H_2O < O_2 + H_2O$.

On the basis of the preceding bond strength analysis and available experimental evidence, the $PrMe_4Cp$ and $Me_5Cp$ precursors appear to be the best precursors for Sr and Ba film growth via ALD or CVD.

It should be obvious that the method of the current invention can be applied to separate constituent simulation that includes ligands, fragments, and atoms.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example the rule set may be applied to select the best precursors for deposition of any metal oxide film, a metal film, a nitride, fluoride, or sulfide by simply using a different reactant in the film growth, but using the rule set to select the precursor. As a second variation, by performing the same calculations, the rule set may select a precursor that is more likely to lead to carbon incorporation in the film if it is desired to have carbon in the film. By extension, a precursor containing other atoms, such as N or Si, may be shown by the rule set to lead to incorporation of the N or Si atom, which may be desirable.

All such variations are considered to be within the scope and spirit of the present invention as defined by the following claims and their legal equivalents.

What is claimed:

1. A method of precursor selection for thin film vapor deposition comprising:
   a. starting with a group of at least two precursors having thermal stability, wherein the precursors comprise a base metal and at least one ligand, and,
   b. using a computer to operate quantum simulations to computationally determine:
      i. a geometry optimization of said precursor candidate for said thin film deposition;
      ii. a geometry optimization of constituents of said precursor candidate for said thin film deposition, wherein said constituents comprise ligands, fragments and/or atoms; and
      iii. bond strengths of said constituents based on the quantum simulations of the geometry optimizations of precursor candidates (per step b. i.) and constituents (per step b. ii.) of said precursor candidate for said thin film deposition, wherein determining the bond strengths includes comparing an energy of a molecule to a bond energy of said molecule constituents, wherein comparing includes comparing a set of bond strengths within a candidate ligand and also between a metal atom and one said ligand;
   c. applying a rule-set on said computationally determined bond strengths of said constituents of said group of precursors for said thin film deposition, wherein said rule-set requires said precursor have parameters comprising:
      i. a bond strength between a metal atom and a ligand is in a range between 0.2 eV and 3 eV and less than metal atom-ligand bond strengths of other precursors, wherein said metal atom and ligand bond strength is greater than $T\Delta S$, wherein T is a reaction temperature and $\Delta S$ is a change in entropy of said reaction; and
      ii. a bond within said ligand having an energy that is greater than said bond strength between said metal atom and said ligand;
   d. wherein said precursor is computationally selected by the method in steps (a) through (c) based on the best results from applying the rule-set of step (c) to the precursors of step (a) based on the simulations of step (b) and also wherein the precursor is capable of being vapor deposited to meet the conditions of:
      i. a film growth rate that is at least 0.4 Angstroms/cycle; and,
      ii. a carbon contamination level less than 0.3 at % and a reduced probability of F contamination.

2. The method of claim 1, wherein said precursor selection is applied to methods of film vapor deposition, whereby said film vapor deposition is selected from the group consisting of chemical vapor deposition, metalorganic chemical vapor deposition, plasma enhanced chemical vapor deposition, atomic layer deposition, and molecular beam epitaxy.

3. The method of claim 1, wherein said thin film is applied to materials selected from the group consisting of ceramics and metals.

4. The method of claim 1, wherein said precursor selection comprises a quantum or atomic simulation, wherein said simulation comprises simulating precursor reaction thermochemistry to determine efficacy for said thin film growth.

* * * * *